(12) United States Patent
Breitwisch et al.

(10) Patent No.: US 8,189,372 B2
(45) Date of Patent: May 29, 2012

(54) INTEGRATED CIRCUIT INCLUDING ELECTRODE HAVING RECESSED PORTION

(75) Inventors: Matthew Breitwisch, Yorktown Heights, NY (US); Shihhung Chen, ChuTung Village (TW); Thomas Happ, Dresden (DE); Eric Joseph, White Plains, NY (US)

(73) Assignees: International Business Machines Corporation, Armonk, NY (US); Macronix International Co., Ltd., Hsin-Chu (TW); Qimonda AG, Munich (DE)

( * ) Notice: Subject to any disclaimer, the term of this patent is extended or adjusted under 35 U.S.C. 154(b) by 215 days.

(21) Appl. No.: 12/025,898

(22) Filed: Feb. 5, 2008

(65) Prior Publication Data

US 2009/0196094 A1  Aug. 6, 2009

(51) Int. Cl.
*G11C 11/00* (2006.01)

(52) U.S. Cl. .......................... 365/163; 257/202; 438/95

(58) Field of Classification Search .................. 257/188, 257/214, 441, 442, 613, 614, E29.296, E45.001–E45.004, 296–313, 533, 595–602, 923–924, 257/E27.016– E27.017, E27.019–E27.021, 257/E27.023–E27.025, E27.03–E27.035, 257/E27.037–E27.038, E27.041–E27.045; 438/95, 171, 190, 210, 238–253, 329, 379, 438/387, 444, 901, 257; 365/163; 257/E27.047–E27.048, E27.071, E27.09, 257/ 257/E27.092–E27.093, E27.095, E27.101, 257/E27.114– E27.116, E21.008–E21.021, 257/E21.364

See application file for complete search history.

(56) References Cited

U.S. PATENT DOCUMENTS

| | | | | |
|---|---|---|---|---|
| 6,791,102 | B2 * | 9/2004 | Johnson et al. | 257/3 |
| 7,067,837 | B2 | 6/2006 | Hwang et al. | |
| 2005/0045915 | A1 * | 3/2005 | Lee | 257/202 |
| 2006/0211165 | A1 * | 9/2006 | Hwang et al. | 438/95 |
| 2006/0246712 | A1 * | 11/2006 | Kim et al. | 438/622 |
| 2007/0025226 | A1 | 2/2007 | Park et al. | |
| 2007/0164266 | A1 * | 7/2007 | Choi | 257/4 |
| 2007/0205406 | A1 * | 9/2007 | Wang et al. | 257/4 |
| 2008/0054323 | A1 * | 3/2008 | Breitwisch et al. | 257/296 |

* cited by examiner

*Primary Examiner* — Wai Sing Louie
*Assistant Examiner* — Sue Tang
(74) *Attorney, Agent, or Firm* — Dicke, Billig & Czaja, PLLC

(57) ABSTRACT

An integrated circuit includes a first electrode including an etched recessed portion. The integrated circuit includes a second electrode and a resistivity changing material filling the recessed portion and coupled to the second electrode.

19 Claims, 12 Drawing Sheets

INTEGRATED CIRCUIT INCLUDING ELECTRODE HAVING RECESSED PORTION

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating. The power used to program a memory cell is based on the electrical and thermal interface between the phase change material and at least one electrode contacting the phase change material.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy. For both single bit and multi-bit applications, process fluctuations between the individual cells should be minimized.

For these and other reasons, there is a need for the present invention.

SUMMARY

One embodiment provides an integrated circuit. The integrated circuit includes a first electrode including an etched recessed portion. The integrated circuit includes a second electrode and a resistivity changing material filling the recessed portion and coupled to the second electrode.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
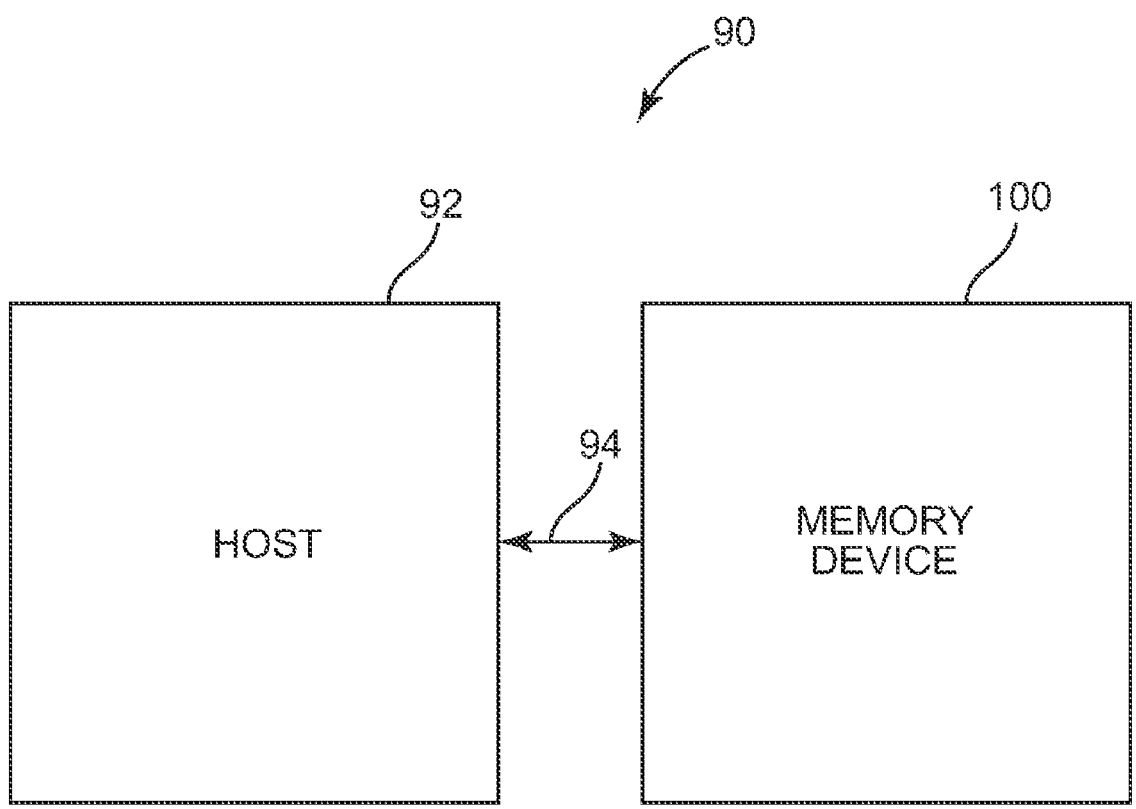
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
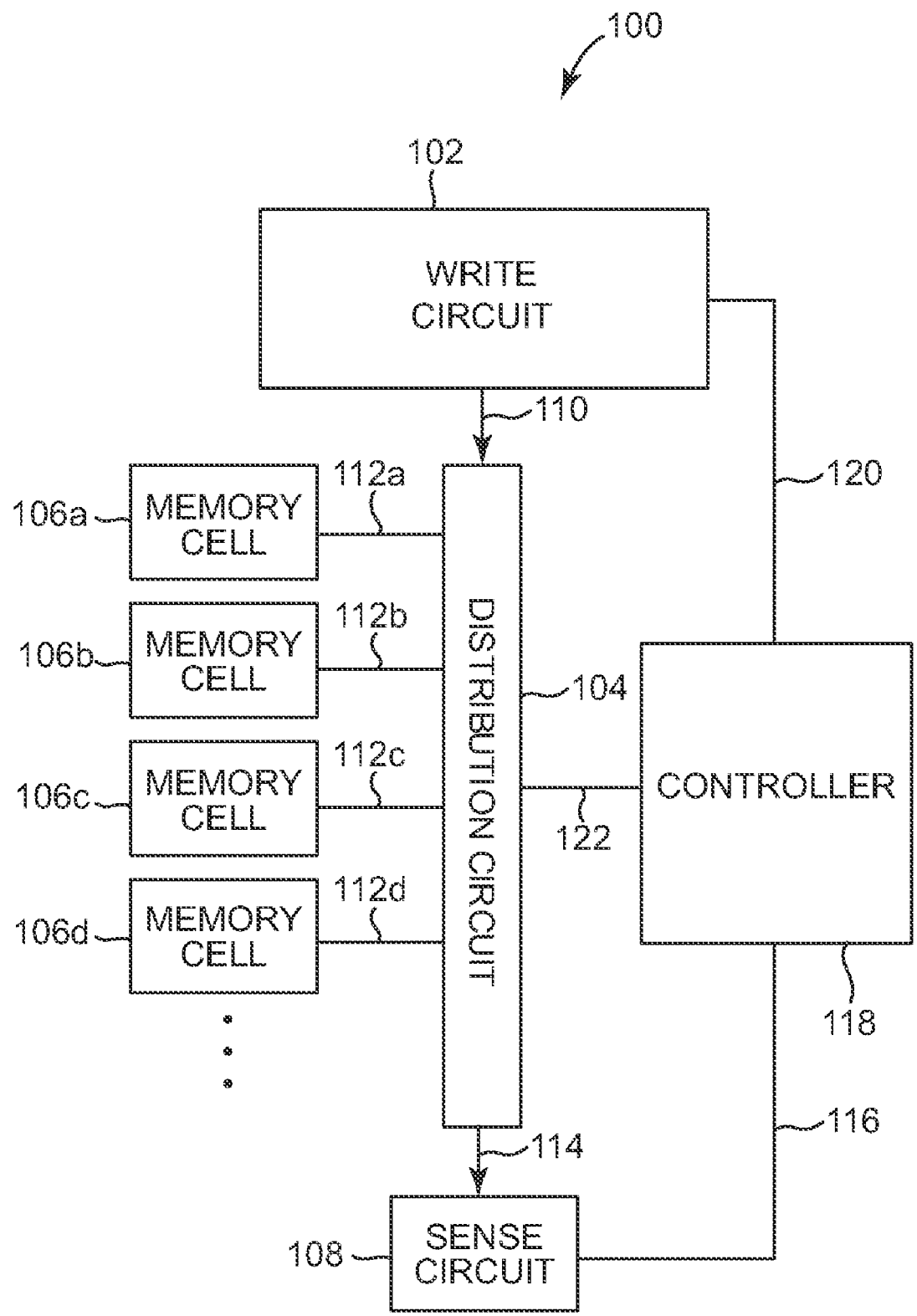
FIG. 2 is a block diagram illustrating one embodiment of a memory device.

FIG. 2 is a block diagram illustrating one embodiment of memory device 100. In one embodiment, memory device 100 is an integrated circuit or part of an integrated circuit. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material and hence the cell resistance is controlled using a suitable write strategy.

Each of the memory cells 106a-106d is a recessed pore memory cell. A pore is formed in a dielectric material and then recessed into a first electrode. The recessed pore is filled with resistivity changing material or phase change material, which contacts the first electrode and a second electrode. The cross-section of the recessed pore and the depth of the recess in the first electrode define the current through each memory cell and the power used to reset each memory cell. In one embodiment, the pore is formed by first using a keyhole process to define an initial opening in a dielectric material layer and then by etching a recess into the first electrode.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11". In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates one or more current or voltage pulses for heating the phase change material in the target memory cell. In one embodiment, write circuit 102 generates appropriate current or voltage pulses, which are fed into distribution circuit 104 and distributed to the appropriate target memory cell 106a-106d. The amplitude and duration of the current or voltage pulses are controlled depending on whether the memory cell is being set or reset. Generally, a "set" operation of a memory cell is heating the phase change material of the target memory cell above its crystallization temperature (but usually below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

Figure 3A:
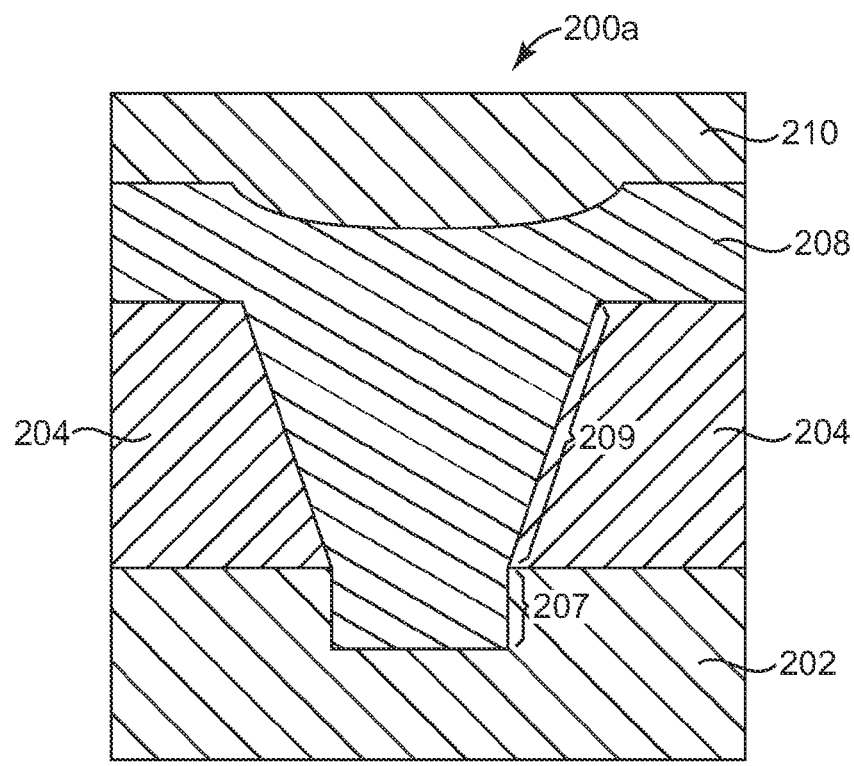
FIG. 3A illustrates a cross-sectional view of one embodiment of a phase change memory cell.

FIG. 3A illustrates a cross-sectional view of one embodiment of a phase change memory cell 200a. In one embodiment, each of the phase change memory cells 106a-106d is similar to phase change memory cell 200a. Phase change memory cell 200a includes a first electrode 202, a dielectric material layer 204, a phase change material 208, and a second electrode 210. First electrode 202 contacts dielectric material layer 204 and phase change material 208. Phase change material 208 contacts second electrode 210. Dielectric material layer 204 and bottom electrode 202 define a recessed pore into which phase change material 208 is deposited. The recessed pore includes a recessed portion 207 defined by a recess in bottom electrode 202 and a pore portion 209 defined by a pore or opening in dielectric material layer 204. In one embodiment, the depth of recessed portion 207 is greater than approximately 10% of the critical dimension of the bottom of pore portion 209. In another embodiment, the depth of recessed portion 207 is within a range between approximately 30-70% of the critical dimension of the bottom of pore portion 209.

In one embodiment, recessed portion 207 has vertical sidewalls. In other embodiments, recessed portion 207 has curved sidewalls. In one embodiment, pore portion 209 has tapered sidewalls. In other embodiments, pore portion 209 has vertical sidewalls. In one embodiment, recessed portion 207 and the top and bottom of pore portion 209 have sublithographic cross-sections. First electrode 202 and second electrode 210 include any suitable electrode material, such as TiN, TaN, W, Al, Ti, Ta, TiSiN, TaSiN, TiAlN, TaAlN, WN, C, or Cu. Dielectric material layer 204 includes any suitable dielectric material, such as SiN.

Phase change material 208 may be made up of a variety of materials in accordance with the present invention. Generally, chalcogenide alloys that contain one or more elements from group VI of the periodic table are useful as such materials. In one embodiment, phase change material 208 of phase change memory cell 200a is made up of a chalcogenide compound material, such as GeSbTe, SbTe, GeTe, or AgInSbTe. In another embodiment, phase change material 208 is chalcogen free, such as GeSb, GaSb, InSb, or GeGaInSb. In other embodiments, phase change material 208 is made up of any suitable material including one or more of the elements Ge, Sb, Te, Ga, As, In, Se, and S.

Phase change material 208 provides a storage location for storing one or more bits of data. Read and write signals are provided to phase change material 208 via first electrode 202 and second electrode 210. During a write operation, the current path through phase change material 208 is from one of first electrode 202 and second electrode 210 through recessed portion 207 and pore portion 209 and to the other of first electrode 202 and second electrode 210.

Figure 3B:
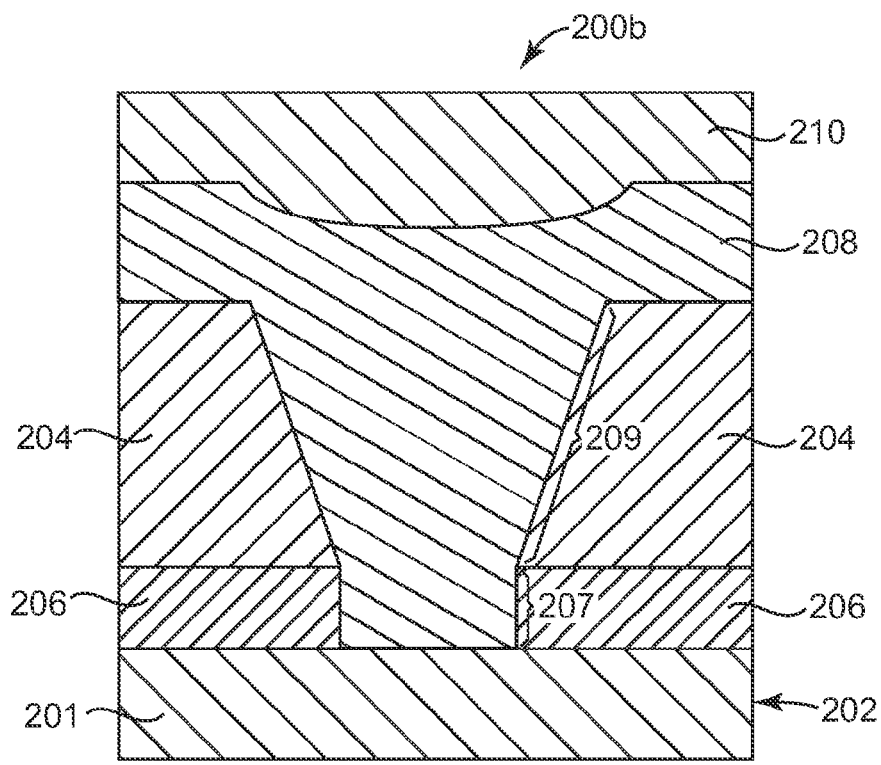
FIG. 3B illustrates a cross-sectional view of another embodiment of a phase change memory cell.

FIG. 3B illustrates a cross-sectional view of another embodiment of a phase change memory cell 200b. In one embodiment, each of the phase change memory cells 106a-106d is similar to phase change memory cell 200b. Phase change memory cell 200b is similar to phase change memory cell 200a previously described and illustrated with reference to FIG. 3A, except that first electrode 202 of phase change memory cell 200b includes a first electrode material 201 and a second electrode material 206. In this embodiment, first portion 207 of the recessed pore is defined by second electrode material 206. The thickness or height of second electrode material 206 defines the depth of the recessed portion 207. In one embodiment, the thickness of second electrode material 206 is greater than approximately 10% of the critical dimension of the bottom of pore portion 209. In another embodiment, the thickness of second electrode material 206 is within a range between approximately 30-70% of the critical dimension of the bottom of pore portion 209.

First electrode material 201 includes any suitable electrode material, such as TiN, TaN, W, Al, Ti, Ta, TiSiN, TaSiN, TiAlN, TaAlN, WN, C, or Cu. Second electrode material 206 includes any suitable electrode material different than first electrode material 201, such as dielectric doped phase change material, TiN, TaN, W, Al, Ti, Ta, TiSiN, TaSiN, TiAlN, TaAlN, WN, C, or Cu. In one embodiment, the thermal conductivity of second electrode material 206 is less than the thermal conductivity of first electrode material 201. In one embodiment, the resistivity of second electrode material 206 is greater than the resistivity of first electrode material 201.

Figure 4A:
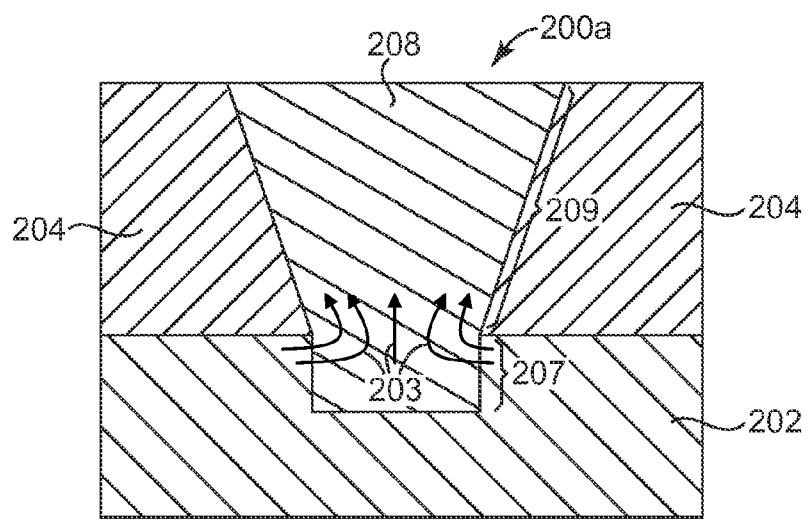
FIG. 4A illustrates a cross-sectional view of one embodiment of a phase change memory cell including an indication of current density.

FIG. 4A illustrates a cross-sectional view of one embodiment of phase change memory cell 200a including an indication of current density. FIG. 4A is also applicable to phase change memory cell 200b. As indicated at 203, current flows from both the bottom and sidewalls of first electrode 202 of recessed portion 207 into phase change material 208. Recessed portion 207 increases the current density through phase change material 208 compared to a pore memory cell not having a recessed portion 207. The current density is increased at the interface between recessed portion 207 and pore portion 209. By increasing the current density, the current used to reset the memory cell to an amorphous state is reduced.

Figure 4B:
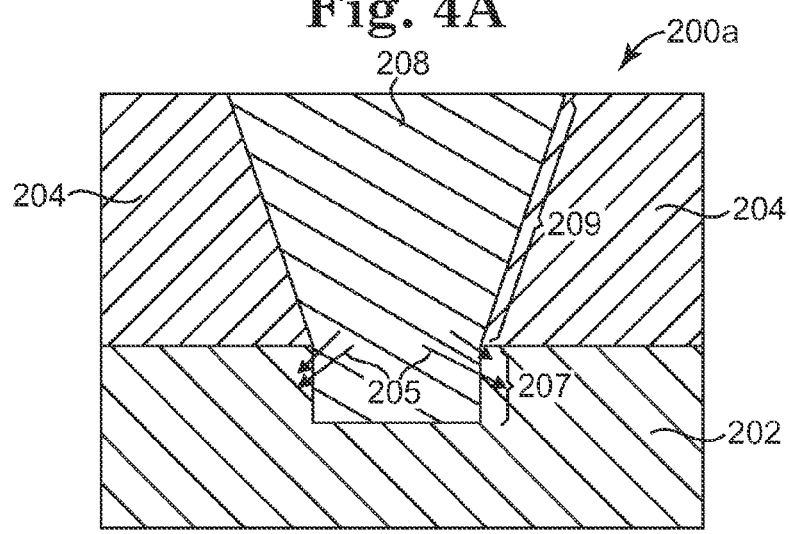
FIG. 4B illustrates a cross-sectional view of one embodiment of a phase change memory cell including an indication of heat loss.

FIG. 4B illustrates a cross-sectional view of one embodiment of phase change memory cell 200a including an indication of heat loss. FIG. 4B is also applicable to phase change memory cell 200b. As indicated at 205, heat flows from phase change material 208 to the sidewalls of first electrode 202 of recessed portion 207. Recessed portion 207 reduces the heat loss from phase change material 208 to bottom electrode 202 compared to a pore memory cell not having a recessed portion 207. By reducing the heat loss, the current used to reset the memory cell to an amorphous state is reduced.

Figure 4C:
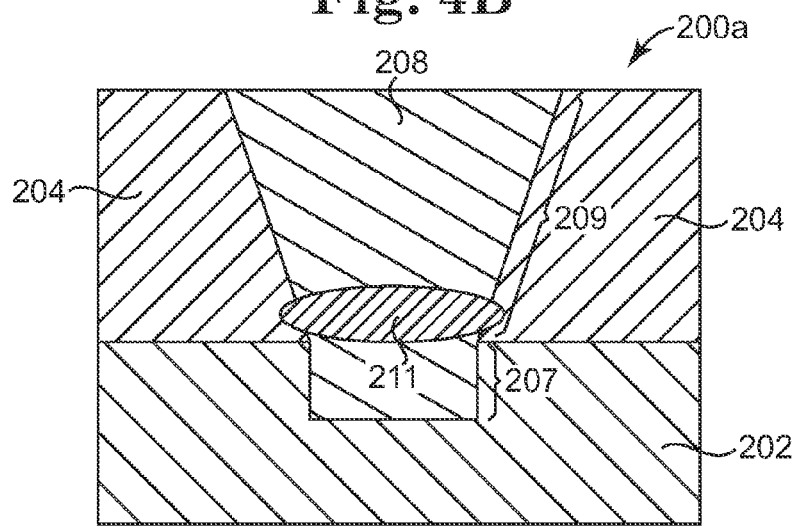
FIG. 4C illustrates a cross-sectional view of one embodiment of a phase change memory cell including an indication of an active region.

FIG. 4C illustrates a cross-sectional view of one embodiment of phase change memory cell 200a including an indication of an active region. FIG. 4C is also applicable to phase change memory cell 200b. Due to the current density increase and the reduction in heat loss as previously described and illustrated with reference to FIGS. 4A and 4B, the hot spot, which defines the active or phase change region in phase change material 208, is indicated at 211. The active region 211 is closer to the bottom of pore portion 209 compared to a pore memory cell not having a recessed portion 207. By moving the active region 211 closer to the bottom of pore portion 209, the current and power used to reset the memory cell to an amorphous state is reduced. In addition, by moving the active region 211 closer to the bottom of pore portion 209, fabrication process variations have a smaller effect on the current and power used to reset the memory cell to the amorphous state.

The following FIGS. 5A-13 illustrate embodiments of a process for fabricating phase change memory cells 200a and 200b previously described and illustrated with reference to FIGS. 3A and 3B.

Figure 5A:
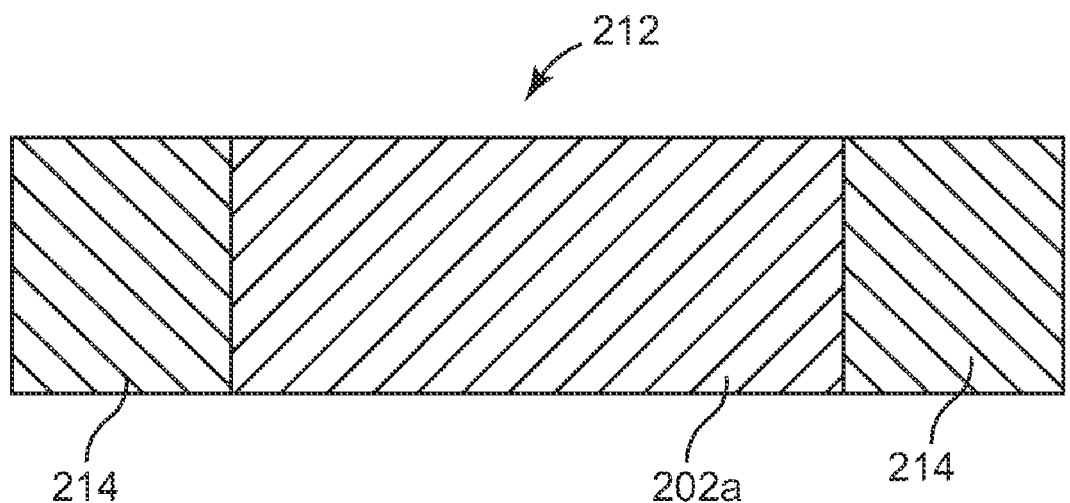
FIG. 5A illustrates a cross-sectional view of one embodiment of a preprocessed wafer.

FIG. 5A illustrates a cross-sectional view of one embodiment of a preprocessed wafer 212. Preprocessed wafer 212 includes a dielectric material 214, a first electrode 202a, and lower wafer layers (not shown). Dielectric material 214 includes $SiO_2$, $SiO_x$, SiN, fluorinated silica glass (FSG), boro-phosphorus silicate glass (BPSG), boro-silicate glass (BSG), or other suitable dielectric material. First electrode 202a includes TiN, TaN, W, Al, Ti, Ta, TiSiN, TaSiN, TiAlN, TaAlN, WN, C, Cu, or other suitable electrode material. Dielectric material 214 laterally surrounds first electrode 202a and isolates first electrode 202a from adjacent device features.

Figure 5B:
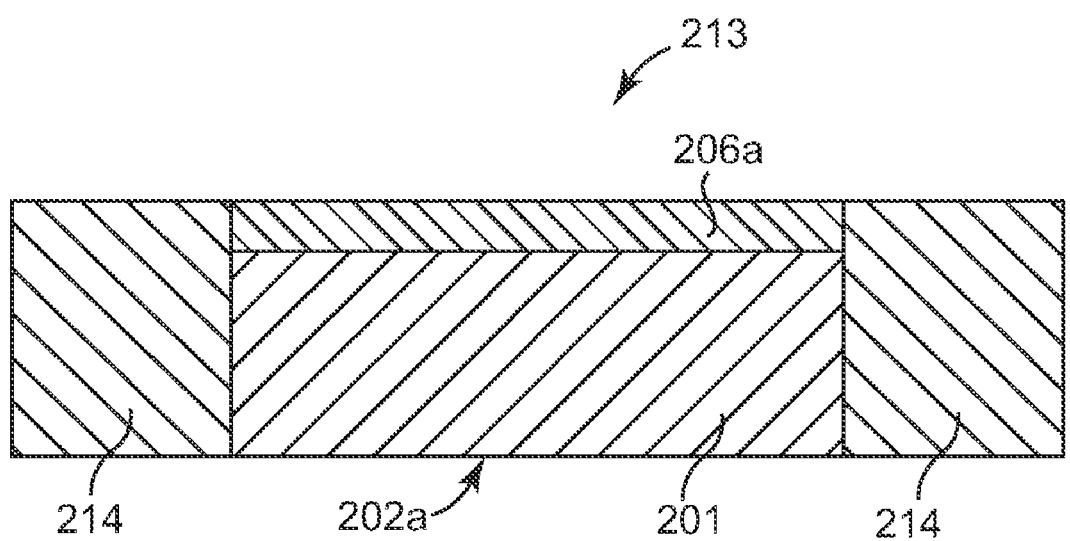
FIG. 5B illustrates a cross-sectional view of another embodiment of a preprocessed wafer.

FIG. 5B illustrates a cross-sectional view of another embodiment of a preprocessed wafer 213. Preprocessed wafer 213 is similar to preprocessed wafer 212 previously described and illustrated with reference to FIG. 5A, except that first electrode 202a of preprocessed wafer 213 includes a first electrode material layer 201 and a second electrode material layer 206a. Second electrode material layer 206a contacts the top of first electrode material layer 201. Dielectric material 214 laterally surrounds first electrode material layer 201 and second electrode material layer 206a and isolates first electrode 202a from adjacent device features. The thickness of second electrode material layer 206a defines the depth of recessed portion 207 in subsequent fabrication processes.

First electrode material layer 201 includes any suitable electrode material, such as TiN, TaN, W, Al, Ti, Ta, TiSiN, TaSiN, TiAlN, TaAlN, WN, C, or Cu. Second electrode material layer 206a includes any suitable electrode material different than first electrode material layer 201, such as dielectric doped phase change material, TiN, TaN, W, Al, Ti, Ta, TiSiN, TaSiN, TiAlN, TaAlN, WN, C, or Cu. In one embodiment, the thermal conductivity of second electrode material layer 206a is less than the thermal conductivity of first electrode material layer 201. In one embodiment, the resistivity of second electrode material layer 206a is greater than the resistivity of first electrode material layer 201.

Figure 6:
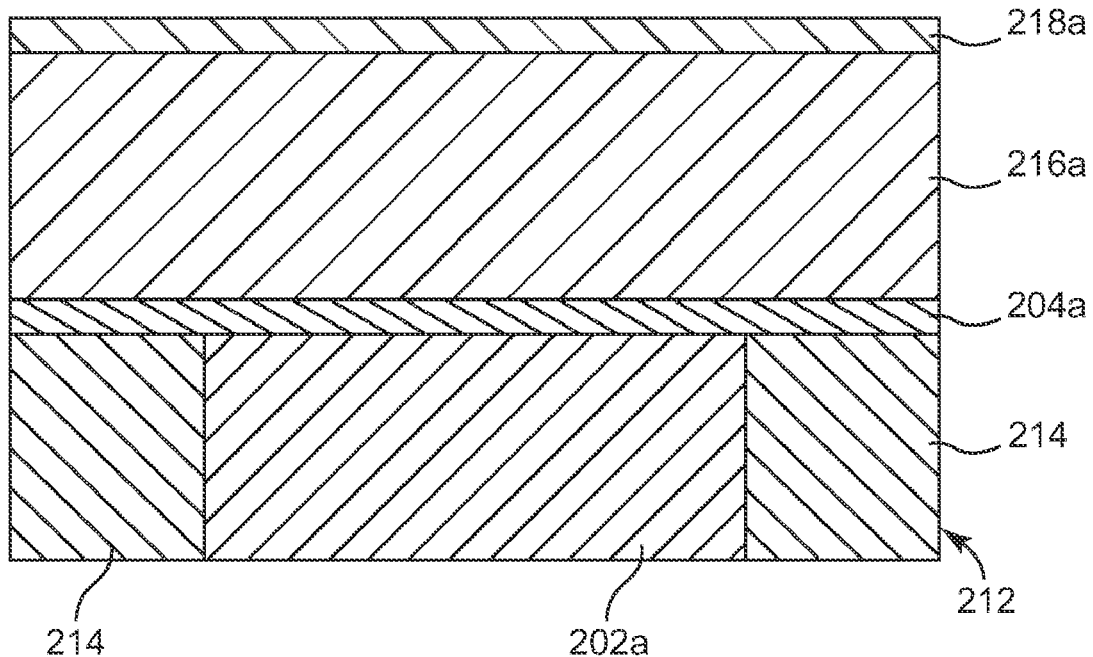
FIG. 6 illustrates a cross-sectional view of one embodiment of the preprocessed wafer, a first dielectric material layer, a second dielectric material layer, and a third dielectric material layer.

FIG. 6 illustrates a cross-sectional view of one embodiment of preprocessed wafer 212, a first dielectric material layer 204a, a second dielectric material layer 216a, and a third dielectric material layer 218a. A dielectric material, such as SiN or another suitable dielectric material is deposited over preprocessed wafer 212 to provide first dielectric material layer 204a. First dielectric material layer 204a is deposited using chemical vapor deposition (CVD), high density plasma-chemical vapor deposition (HDP-CVD), atomic layer deposition (ALD), metal organic chemical vapor deposition (MOCVD), plasma vapor deposition (PVD), jet vapor deposition (JVD), or other suitable deposition technique.

A second dielectric material different than the dielectric material of first dielectric material layer 204a, such as $SiO_2$ or other suitable material is deposited over first dielectric material layer 204a to provide second dielectric material layer 216a. Second dielectric material layer 216a is thicker than first dielectric material layer 204a. In one embodiment, second dielectric material layer 216a is at least four times thicker than first dielectric material layer 204a. Dielectric material layer 216a is deposited using CVD, HDP-CVD, ALD, MOCVD, PVD, JVD, or other suitable deposition technique.

A third dielectric material, such as SiN or another suitable dielectric material is deposited over second dielectric material layer 216a to provide third dielectric material layer 218a. In one embodiment, this third dielectric material layer is similar to the dielectric material of dielectric material layer 204a. Third dielectric material layer 218a is thinner than second dielectric material layer 216a. In one embodiment, third dielectric material layer 218a has substantially the same thickness as first dielectric material layer 204a. Third dielectric material layer 218a is deposited using CVD, HDP-CVD, ALD, MOCVD, PVD, JVD, or other suitable deposition technique.

Figure 7:
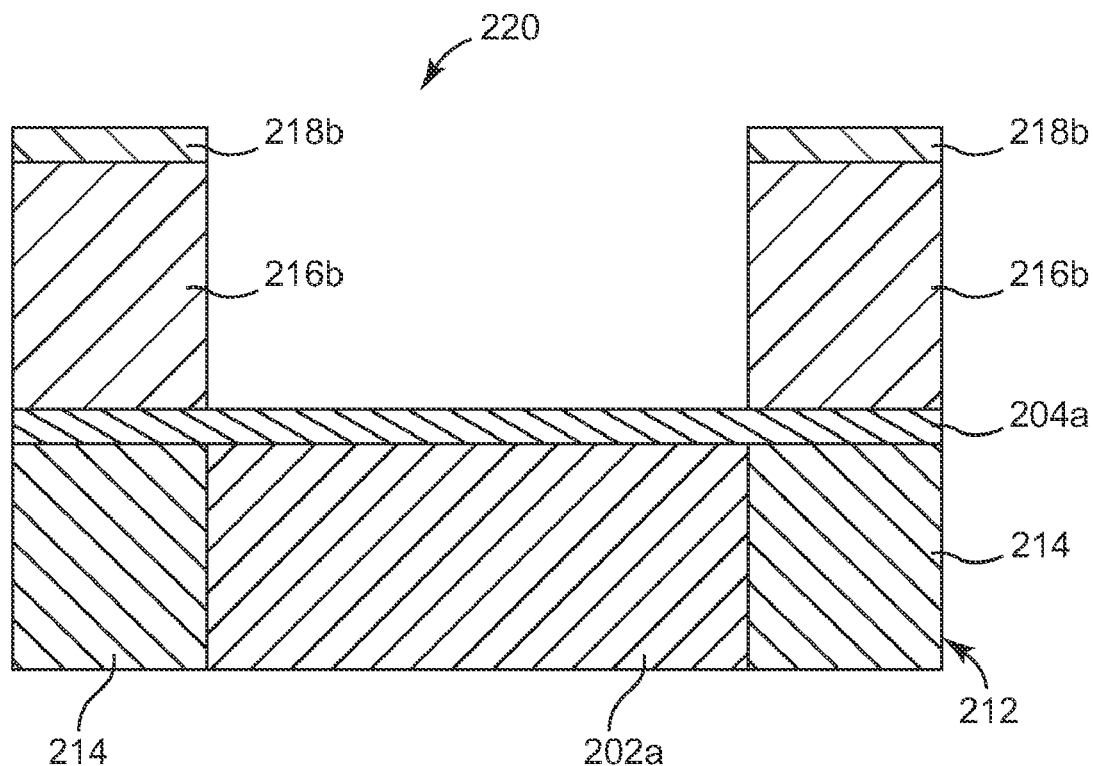
FIG. 7 illustrates a cross-sectional view of one embodiment of the preprocessed wafer, the first dielectric material layer, the second dielectric material layer, and the third dielectric material layer after etching the third dielectric material layer and the second dielectric material layer.

FIG. 7 illustrates a cross-sectional view of one embodiment of preprocessed wafer 212, first dielectric material layer 204a, second dielectric material layer 216b, and third dielectric material layer 218b after etching third dielectric material layer 218a and second dielectric material layer 216a. Third dielectric material layer 218a and second dielectric material layer 216a are etched to provide opening 220 exposing first dielectric material layer 204a and to provide second dielectric material layer 216b and third dielectric material layer 218b. In one embodiment, opening 220 is substantially centered over first electrode 202a.

Figure 8:
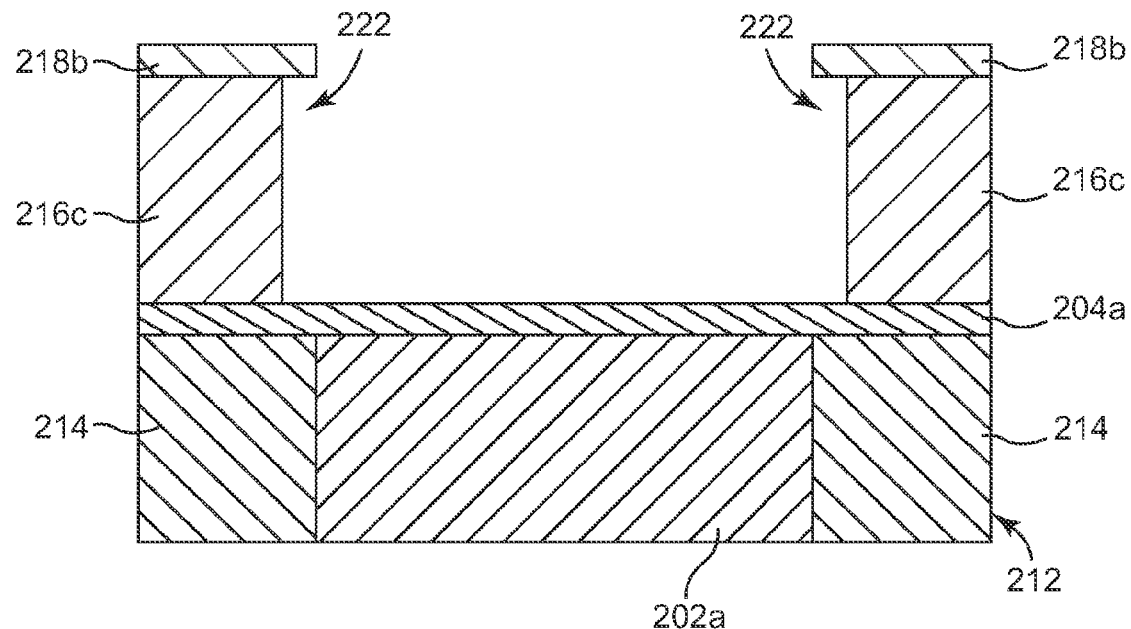
FIG. 8 illustrates a cross-sectional view of one embodiment of the preprocessed wafer, the first dielectric material layer, the second dielectric material layer, and the third dielectric material layer after etching the second dielectric material layer.

FIG. 8 illustrates a cross-sectional view of one embodiment of preprocessed wafer 212, first dielectric material layer 204a, second dielectric material layer 216c, and third dielectric material layer 218b after etching second dielectric material layer 216b. Second dielectric material layer 216b is selectively recess etched using a selective wet etch or other suitable etch to create overhang of third dielectric material layer 218b as indicated at 222.

Figure 9:
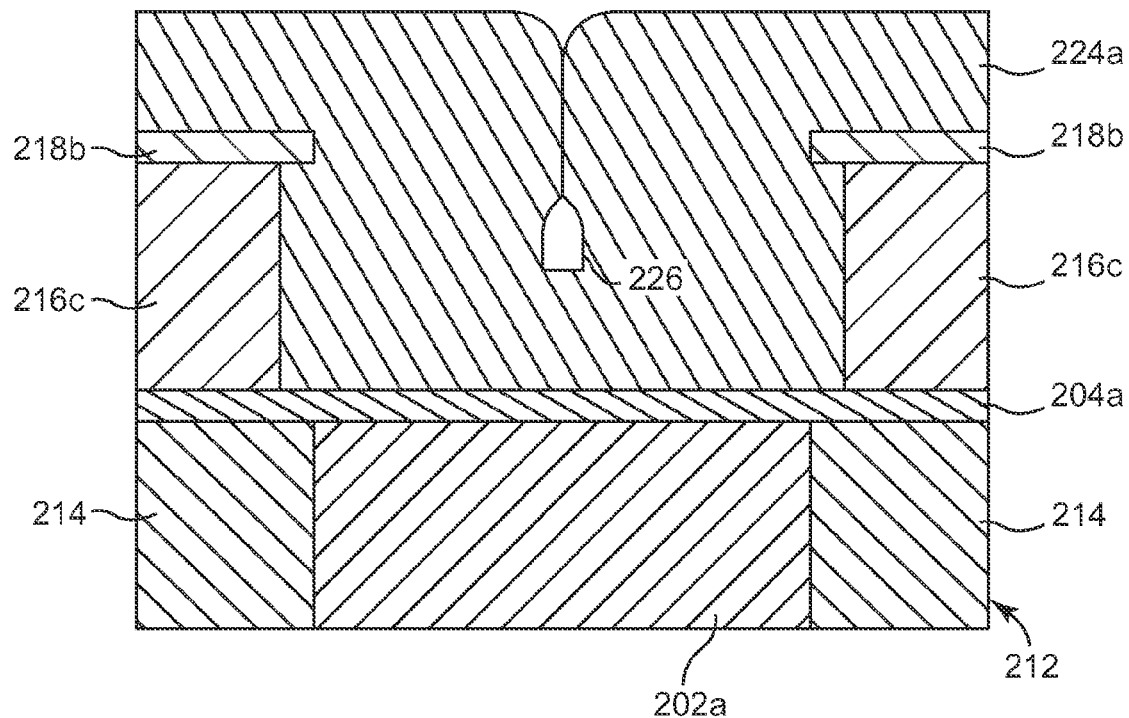
FIG. 9 illustrates a cross-sectional view of one embodiment of the preprocessed wafer, the first dielectric material layer, the second dielectric material layer, the third dielectric material layer, and a keyhole formed in a polysilicon layer.

FIG. 9 illustrates a cross-sectional view of one embodiment of preprocessed wafer 212, first dielectric material layer 204a, second dielectric material layer 216c, third dielectric material layer 218b, and a keyhole 226 formed in a polysilicon layer 224a. Polysilicon or another suitable material is conformally deposited over exposed portions of third dielectric material layer 218b, second dielectric material layer 216c, and first dielectric material layer 204a. Due to overhang 222, the conformal deposition of polysilicon pinches itself off forming a void or keyhole 226. Keyhole 226 is substantially centered over first electrode 202a. Polysilicon layer 224a is deposited using CVD, HDP-CVD, ALD, MOCVD, PVD, JVD, or other suitable deposition technique.

Figure 10:
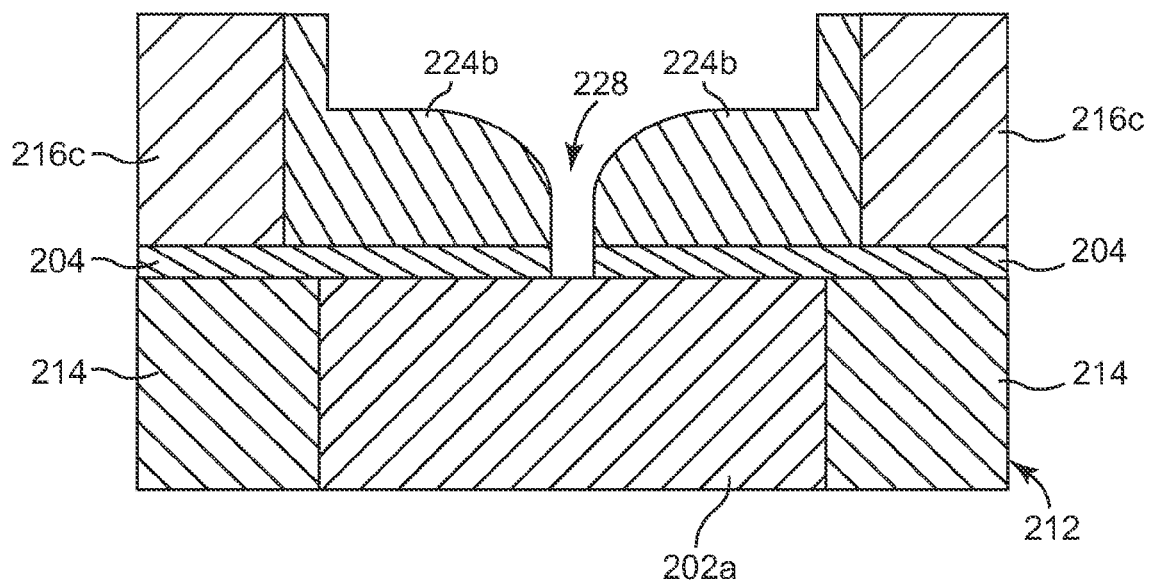
FIG. 10 illustrates a cross-sectional view of one embodiment of the preprocessed wafer, the first dielectric material layer, the second dielectric material layer, and the polysilicon layer after etching the polysilicon layer and the first dielectric material layer.

FIG. 10 illustrates a cross-sectional view of one embodiment of preprocessed wafer 212, first dielectric material layer 204, second dielectric material layer 216c, and polysilicon layer 224b after etching polysilicon layer 224a and first dielectric material layer 204a. Third dielectric material layer 218b is removed. Polysilicon layer 224a is etched to expose keyhole 226. Keyhole 226 is then transferred into first dielectric material layer 204a as indicated by opening 228 to provide polysilicon layer 224b and first dielectric material layer 204. In one embodiment, opening or pore 228 has a sublithographic cross-section such that the exposed portion of first electrode 202a has a sublithographic cross-section.

Figure 11:
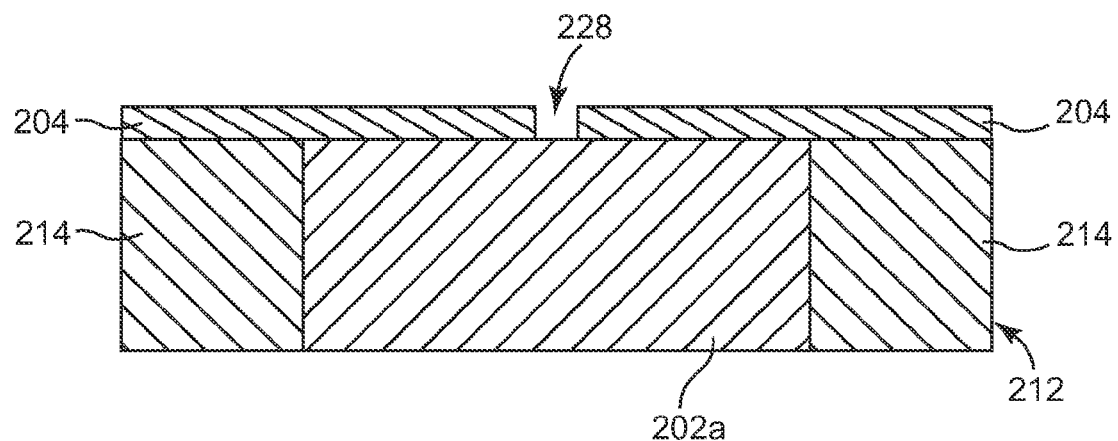
FIG. 11 illustrates a cross-sectional view of one embodiment of the preprocessed wafer and the first dielectric material layer after removing the polysilicon layer and the second dielectric material layer.

FIG. 11 illustrates a cross-sectional view of one embodiment of preprocessed wafer 212 and first dielectric material layer 204 after removing polysilicon layer 224b and second dielectric material layer 216c. Second dielectric material layer 216c and polysilicon layer 224b are etched to expose first dielectric material layer 204. In one embodiment, opening 228 provides pore portion 209 and has vertical sidewalls. In another embodiment, opening 228 has tapered sidewalls.

Figure 12A:
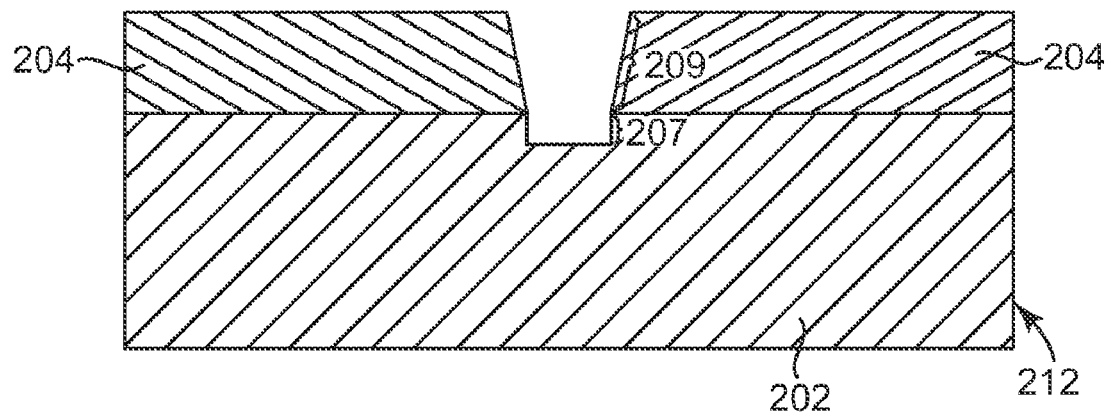
FIG. 12A illustrates a cross-sectional view of one embodiment of the preprocessed wafer, the first dielectric material layer, and a bottom electrode including a recessed portion.

FIG. 12A illustrates a cross-sectional view of one embodiment of preprocessed wafer 212, first dielectric material layer 204, and bottom electrode 202 including a recessed portion 207. The exposed portion of first electrode 202a is etched to provide recessed portion 207 and bottom electrode 202. In one embodiment, pore portion 209 and recessed portion 207 are etched using a single etching process. In another embodiment, a two step etching process is used. In the two step etching process, a first selective etching process is used to provide pore portion 209 and a second selective etching process is used to provide recessed portion 207.

In one embodiment, bottom electrode 202a is etched to a depth greater than approximately 10% of the critical dimension of the bottom of pore portion 209 to provide recessed portion 207. In another embodiment, bottom electrode 202a is etched to a depth within a range between approximately 30-70% of the critical dimension of the bottom of pore portion 209. In one embodiment, bottom electrode 202a is etched to provide a recessed portion 207 having vertical sidewalls. In other embodiments, bottom electrode 202a is etched to provide a recessed portion 207 having curved sidewalls.

Figure 12B:
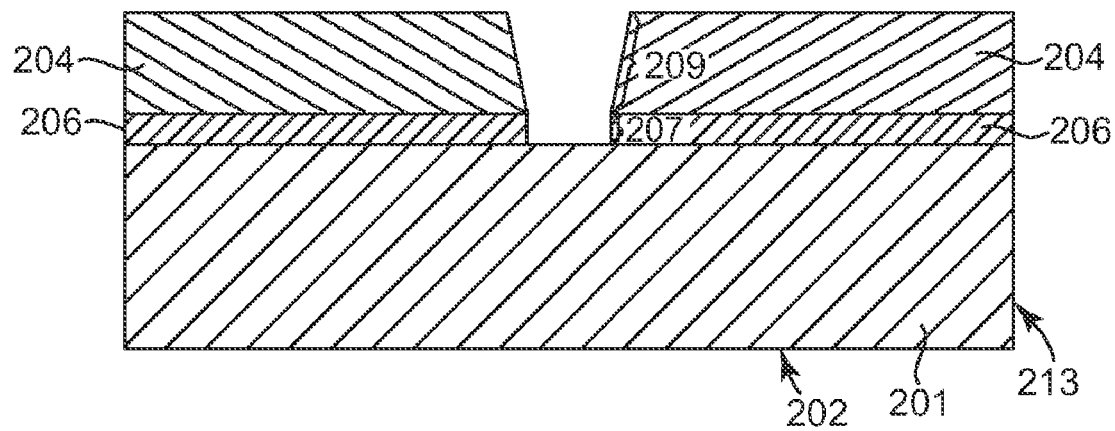
FIG. 12B illustrates a cross-sectional view of one embodiment of a preprocessed wafer, the first dielectric material layer, and a bottom electrode including a recessed portion.

FIG. 12B illustrates a cross-sectional view of one embodiment of preprocessed wafer 213, first dielectric material layer 204, and bottom electrode 202 including a recessed portion 207. In this embodiment, the exposed portion of second electrode material layer 206a (FIG. 5B) is etched to expose first electrode material layer 201 to provide recessed portion 207 and bottom electrode 202. In one embodiment, pore portion 209 and recessed portion 207 are etched using a single etching process. In another embodiment, a two step etching process is used. In the two step etching process, a first selective etching process is used to provide pore portion 209 and a second selective etching process is used to provide recessed portion 207.

In this embodiment, the thickness of second electrode material layer 206a defines the depth of recessed portion 207. In one embodiment, the depth of recessed portion 207 is greater than approximately 10% of the critical dimension of the bottom of pore portion 209. In another embodiment, the depth of recessed portion 207 is within a range between approximately 30-70% of the critical dimension of the bottom of pore portion 209. In one embodiment, second electrode material layer 206a is etched to provide a recessed portion 207 having vertical sidewalls. In other embodiments, second electrode material layer 206a is etched to provide a recessed portion 207 having curved sidewalls.

Figure 13:
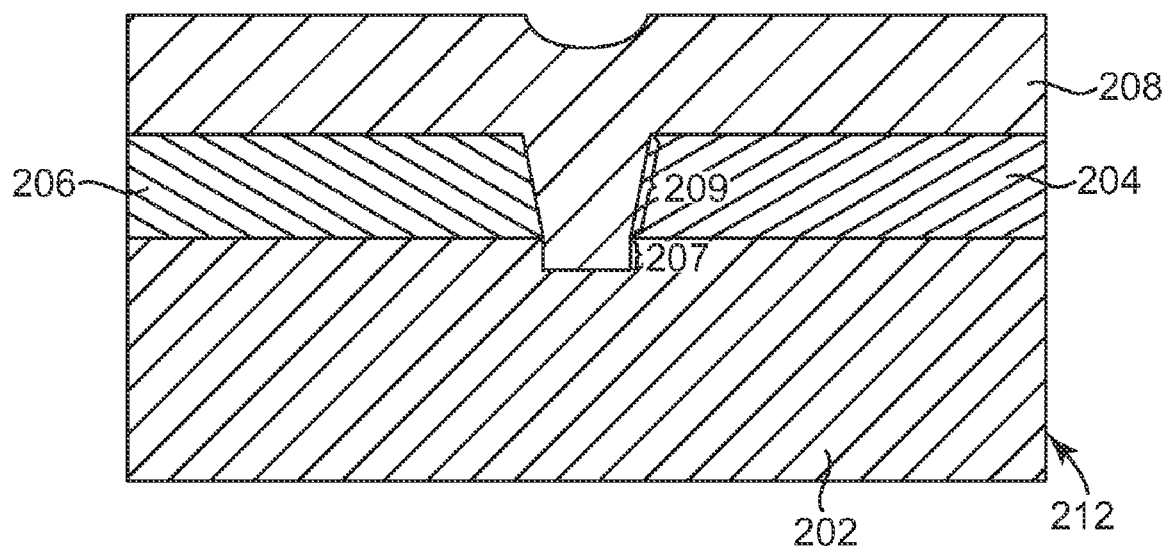
FIG. 13 illustrates a cross-sectional view of one embodiment of the preprocessed wafer, the first dielectric material layer, the bottom electrode including the recessed portion, and a phase change material layer.

FIG. 13 illustrates a cross-sectional view of one embodiment of preprocessed wafer 212, first dielectric material layer 204, bottom electrode 202 including recessed portion 207, and a phase change material 208. A phase change material, such as a chalcogenide compound material or other suitable phase change material is deposited over exposed portions of dielectric material layer 204 and first electrode 202 to provide phase change material 208. Phase change material 208 is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, WN, C, Cu, or other suitable electrode material is deposited over phase change material 208 to provide second electrode 210 and phase change memory cell 200a as previously described and illustrated with reference to FIG. 3A. The electrode material is deposited using CVD, HDP-CVD, ALD, MOCVD, PVD, JVD, or other suitable deposition technique. In another embodiment, where preprocessed wafer 213 is used in place of preprocessed wafer 212, phase change memory cell 200b as previously described and illustrated with reference to FIG. 3B is fabricated.

Figure 14:
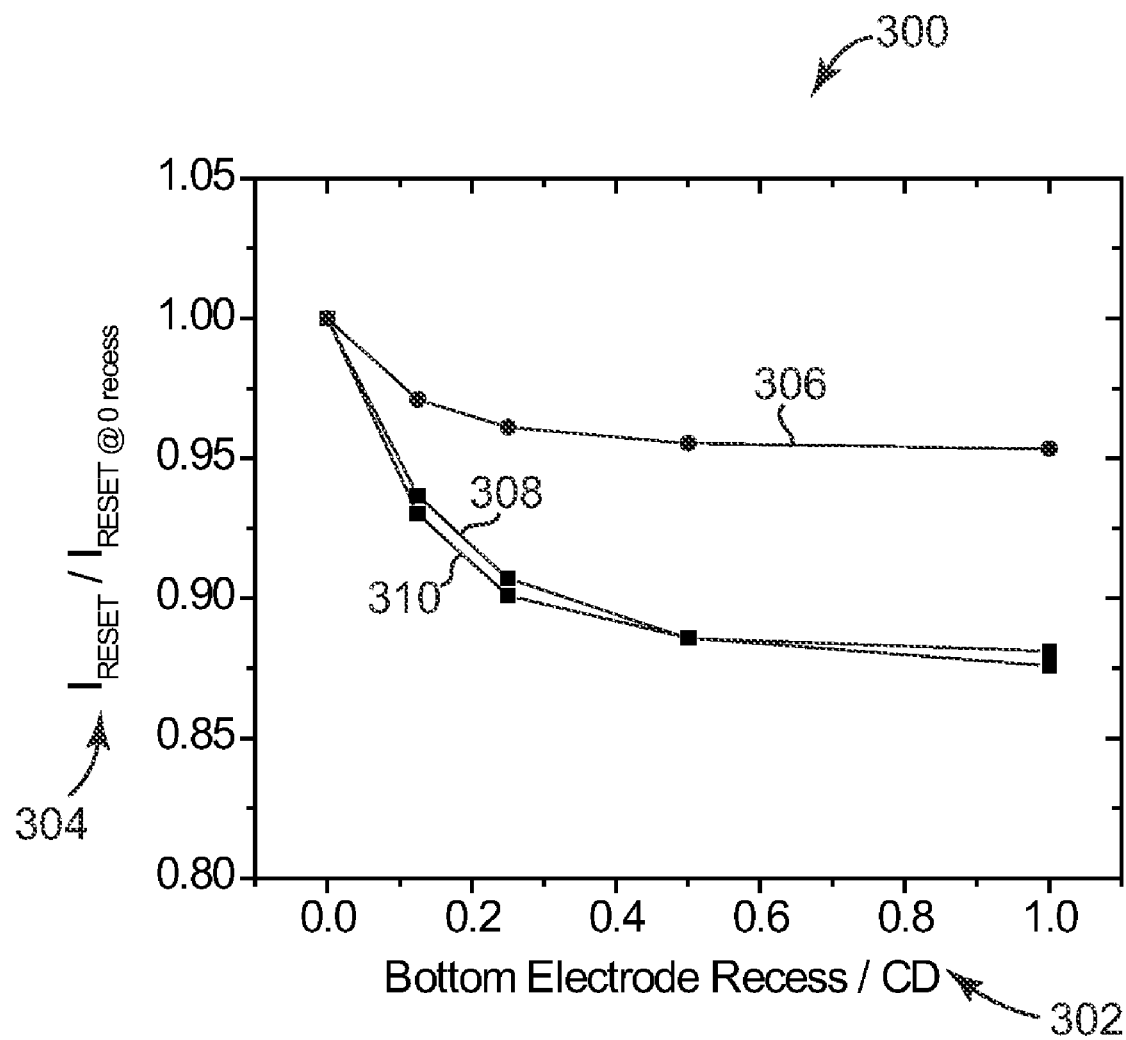
FIG. 14 is a chart illustrating one embodiment of the relationship between the reset current and the bottom electrode recess for a phase change memory cell.

FIG. 14 is a chart 300 illustrating one embodiment of the relationship between the reset current and the bottom electrode recess for a phase change memory cell. Chart 300 includes the bottom electrode recess divided by the critical dimension on x-axis 302 and normalized reset current (i.e., the reset current for a recessed pore memory cell divided by the reset current for a pore memory cell without a bottom electrode recess) on y-axis 304. Curve 306 illustrates simulation data for a recessed pore having vertical pore sidewalls. Curve 308 illustrates simulation data for a recessed pore having 60° pore sidewalls and a pore bottom critical dimension of 40 nm. Curve 310 illustrates simulation data for a recessed pore having 60° pore sidewalls and a pore bottom critical dimension of 20 nm.

As illustrated by chart 300, the reset current decreases in response to an increase in the bottom electrode recess. The decrease in reset current is exhibited for both a recessed pore having vertical sidewalls and tapered sidewalls, although the decrease in reset current is more pronounced for a recessed pore having tapered sidewalls. The decrease in reset current is also independent of the bottom critical dimension of the pore as indicated by the similarity between curve 308 and 310. As illustrated by chart 300, by recessing the bottom electrode by an amount equal to approximately 20% of the bottom critical dimension of the pore, the reset current is reduced by approximately 8%. The decrease in reset current is exhibited by memory cells including bottom electrode recesses having vertical sidewalls and bottom electrode recesses having curved sidewalls.

Figure 15:
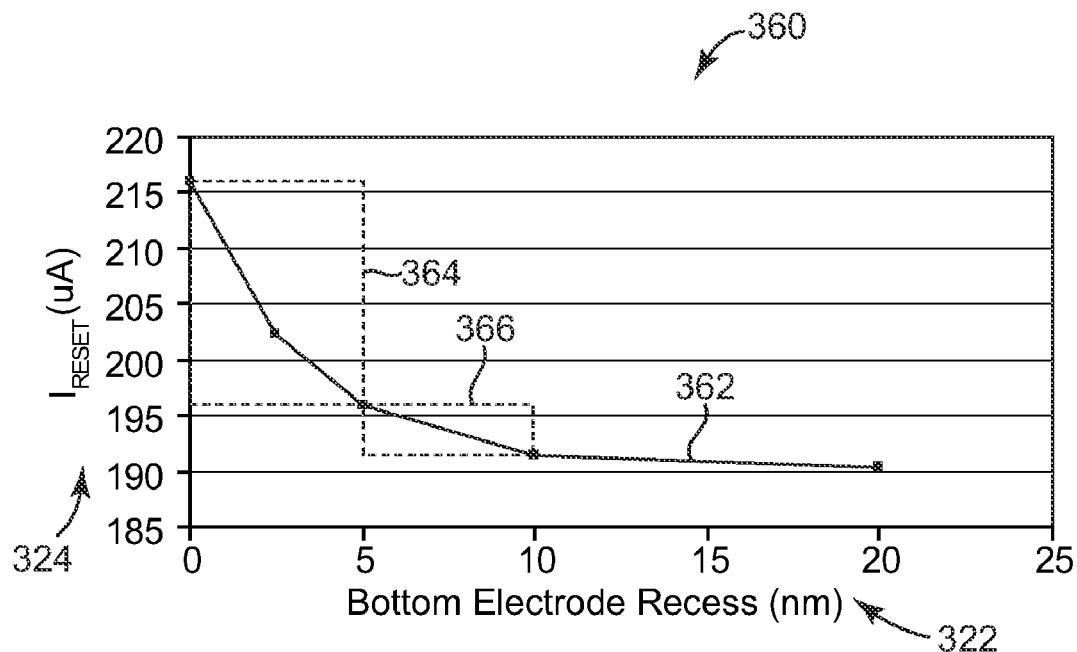
FIG. 15 is a chart illustrating another embodiment of the effect of process variations on a phase change memory cell.

FIG. 15 is a chart 360 illustrating another embodiment of the effect of process variations on a phase change memory cell. Chart 360 includes bottom electrode recess in nanometers on x-axis 322 and reset current in microamps on y-axis 324. Curve 362 illustrates simulation data for a recessed pore having a pore top critical dimension of 35 nm and a pore bottom critical dimension of 20 nm.

In one embodiment, the process variation for etching the recess in the bottom electrode is +/−2.5 nm. As illustrated by chart 360, the reset current of a memory cell may vary by up to approximately 9.3% as indicated at 364 for a target recess of 2.5 nm. For a target recess of 7.5 nm, the reset current of a memory cell may vary by up to approximately 2.1% as indicated at 366. Therefore, by increasing the target depth of the recess in the bottom electrode, the reset current variation of a memory cell can be reduced from 9.3% to 2.1%, thus improving the manufacturability of the memory cell.

Figure 16:
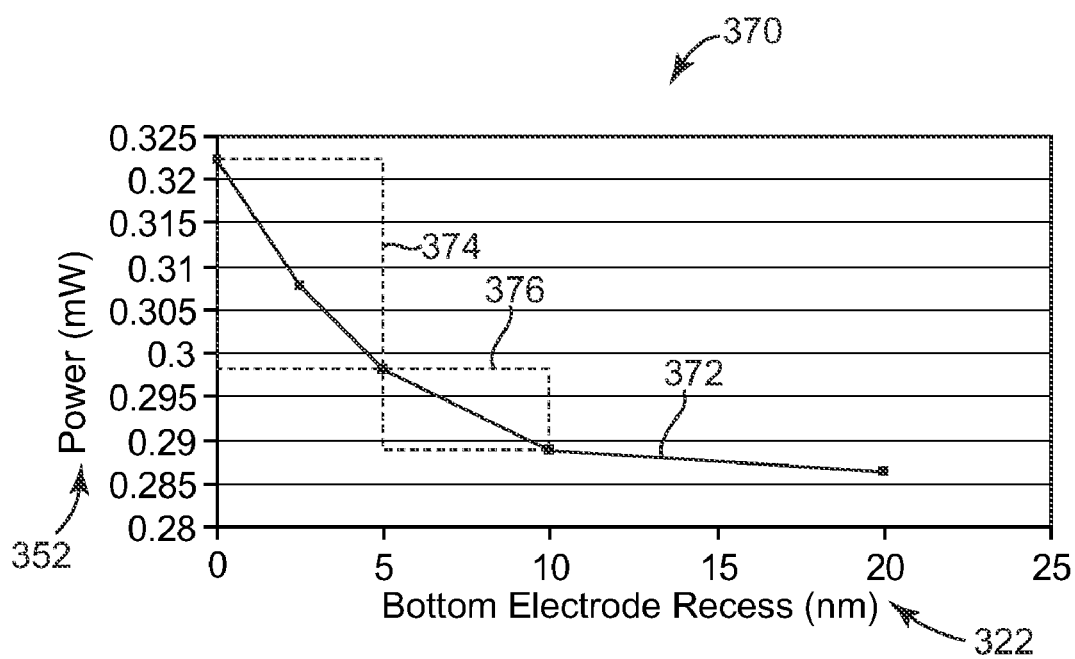
FIG. 16 is a chart illustrating another embodiment of the effect of process variations on a phase change memory cell.

FIG. 16 is a chart 370 illustrating another embodiment of the effect of process variations on a phase change memory cell. Chart 370 includes bottom electrode recess in nanometers on x-axis 322 and reset power in milliwatts on y-axis 352. Curve 370 illustrates simulation data for a recessed pore having a pore top critical dimension of 35 nm and a pore bottom critical dimension of 20 nm.

In one embodiment, the process variation for etching the recess in the bottom electrode is +/−2.5 nm. As illustrated by chart 370, the reset power of a memory cell may vary by up to approximately 7.5% as indicated at 374 for a target recess of 2.5 nm. For a target recess of 7.5 nm, the reset power of a memory cell may vary by up to approximately 2.9% as indicated at 376.

Therefore, by increasing the target depth of the recess in the bottom electrode, the reset power variation of a memory cell can be reduced from 7.5% to 2.9%, thus improving the manufacturability of the memory cell.

Embodiments provide a phase change memory cell having a recessed pore into which phase change material is deposited. In one embodiment, the pore is defined using a keyhole process and then further recessed into an electrode. The recess in the electrode improves the current density and the thermal insulation of the active region of the memory cell and reduces both the current and power used to program the memory cell. The recess also reduces the variation in the reset current and power used to program the memory cell due to fabrication process variations.

While the specific embodiments described herein substantially focused on using phase change memory elements, the embodiments can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first electrode including an etched recessed portion having a planar bottom surface;
a second electrode;
a resistivity changing material filling the recessed portion and contacting the planar bottom surface, the resistivity changing material coupled to the second electrode, and the resistivity changing material having a first width at the planar bottom surface of the recessed portion between sidewalls of the recessed portion; and
a dielectric material laterally surrounding and directly contacting sidewalls of the resistivity changing material,
wherein the resistivity changing material has a second width between the sidewalls of the resistivity changing material laterally surrounded and directly contacted by the dielectric material, the second width greater than the first width,
wherein the first electrode includes a first electrode material layer and a second electrode material layer, the recessed portion provided in the first electrode material layer and extending through the first electrode material layer, and
wherein the planar bottom surface of the recessed portion is a top surface of the second electrode material layer.

2. The integrated circuit of claim 1, wherein a thermal conductivity of the first electrode material layer is less than a thermal conductivity of the second electrode material layer, and
wherein a resistivity of the first electrode material layer is greater than a resistivity of the second electrode material layer.

3. The integrated circuit of claim 1, wherein the dielectric material layer defines a pore comprising a bottom having a critical dimension,
wherein the resistivity changing material fills the pore, and
wherein the recessed portion has a depth greater than 10% of the critical dimension of the pore.

4. The integrated circuit of claim 1, wherein the dielectric material layer defines a pore comprising a bottom having a critical dimension,
wherein the resistivity changing material fills the pore, and
wherein the recessed portion has a depth within a range of 30-70% of the critical dimension of the pore.

5. A system comprising:
a host; and
a memory device communicatively coupled to the host, the memory device including a recessed pore phase change memory cell comprising:
an electrode including an etched recessed portion having a planar bottom surface;
a phase change material deposited in the recessed portion and contacting the planar bottom surface, the phase change material having a first width at the planar bottom surface of the recessed portion between sidewalls of the recessed portion; and
a dielectric material laterally surrounding and directly contacting sidewalls of the phase change material,
wherein the phase change material has a second width between the sidewalls of the phase change material laterally surrounded and directly contacted by the dielectric material, the second width greater than the first width,
wherein the electrode includes a first electrode material layer and a second electrode material layer, the recessed portion provided in the first electrode material layer and extending through the first electrode material layer, and
wherein the planar bottom surface of the recessed portion is a top surface of the second electrode material layer.

6. The system of claim 5, wherein a thermal conductivity of the first electrode material layer is less than a thermal conductivity of the second electrode material layer, and
  wherein a resistivity of the first electrode material layer is greater than a resistivity of the second electrode material layer.

7. The system of claim 5, wherein the memory device further comprises:
  a write circuit configured to write a resistance state to the recessed pore phase change memory cell;
  a sense circuit configured to read a resistance state of the recessed pore phase change memory cell; and
  a controller configured to control the write circuit and the sense circuit.

8. A memory comprising:
  an electrode including an etched recessed portion having a planar bottom surface;
  a dielectric material layer including an etched pore; and
  phase change material in the recessed portion and the pore, the phase change material contacting the planar bottom surface, and the phase change material having a first width at the planar bottom surface of the recessed portion between sidewalls of the recessed portion,
  wherein the dielectric material layer laterally surrounds and directly contacts sidewalls of the phase change material,
  wherein the phase change material has a second width between the sidewalls of the phase change material laterally surrounded and directly contacted by the dielectric material, the second width greater than the first width,
  wherein the electrode includes a first electrode material layer and a second electrode material layer, the recessed portion provided in the first electrode material layer and extending through the first electrode material layer, and
  wherein the planar bottom surface of the recessed portion is a top surface of the second electrode material layer.

9. The memory of claim 8, wherein the pore has tapered sidewalls.

10. The memory of claim 8, wherein the pore has vertical sidewalls.

11. The memory of claim 8, wherein the recessed portion has vertical sidewalls.

12. The memory of claim 8, wherein the recessed portion has curved sidewalls.

13. An integrated circuit comprising:
  a first electrode including a first electrode material layer and a second electrode material layer, the first electrode material layer comprising a recessed portion extending through the first electrode material layer;
  a second electrode; and
  a resistivity changing material filling the recessed portion and directly contacting the first electrode material layer and a top surface of the second electrode material layer, the resistivity changing material coupled to the second electrode.

14. The integrated circuit of claim 13, further comprising:
  a dielectric material laterally surrounding and directly contacting sidewalls of the resistivity changing material.

15. The integrated circuit of claim 14, wherein the recessed portion comprises vertical sidewalls, and
  wherein the dielectric material comprises tapered sidewalls.

16. The integrated circuit of claim 13, wherein a thermal conductivity of the first electrode material layer is less than a thermal conductivity of the second electrode material layer, and
  wherein a resistivity of the first electrode material layer is greater than a resistivity of the second electrode material layer.

17. A memory comprising:
  a first electrode including a first electrode material layer and a second electrode material layer, the first electrode material layer comprising a recessed portion extending through the first electrode material layer;
  a phase change material filling the recessed portion and directly contacting sidewalls of the first electrode material layer and a top surface of the second electrode material layer;
  a dielectric material comprising sidewalls directly contacting the phase change material; and
  a second electrode directly contacting a top surface of the phase change material.

18. The memory of claim 17, wherein the sidewalls of the first electrode material layer comprise vertical sidewalls, and
  wherein the sidewalls of the dielectric material comprise tapered sidewalls.

19. The memory of claim 17, wherein a thermal conductivity of the first electrode material layer is less than a thermal conductivity of the second electrode material layer, and
  wherein a resistivity of the first electrode material layer is greater than a resistivity of the second electrode material layer.

* * * * *